(12) United States Patent
Kim

(10) Patent No.: US 12,142,592 B2
(45) Date of Patent: Nov. 12, 2024

(54) SEMICONDUCTOR PACKAGE INCLUDING STACKED SEMICONDUCTOR CHIPS

(71) Applicant: SK hynix Inc., Icheon-si (KR)

(72) Inventor: Jong Hyun Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 1 day.

(21) Appl. No.: 18/303,300

(22) Filed: Apr. 19, 2023

(65) Prior Publication Data

US 2023/0253360 A1 Aug. 10, 2023

Related U.S. Application Data

(63) Continuation of application No. 17/222,505, filed on Apr. 5, 2021, now Pat. No. 11,664,343.

(30) Foreign Application Priority Data

Dec. 16, 2020 (KR) .......................... 10-2020-0176646

(51) Int. Cl.
H01L 23/00 (2006.01)
H01L 25/18 (2023.01)

(52) U.S. Cl.
CPC .............. *H01L 24/48* (2013.01); *H01L 24/05* (2013.01); *H01L 24/85* (2013.01); *H01L 25/18* (2013.01); *H01L 24/06* (2013.01); *H01L 24/49* (2013.01); *H01L 2224/02141* (2013.01); *H01L 2224/04042* (2013.01); *H01L 2224/05541* (2013.01); *H01L 2224/05553* (2013.01); *H01L 2224/05558* (2013.01); *H01L 2224/06135* (2013.01); *H01L 2224/48106* (2013.01); *H01L 2224/48145* (2013.01); *H01L 2224/4846* (2013.01); *H01L 2224/48464* (2013.01);
(Continued)

(58) Field of Classification Search
CPC ......... H01L 24/48; H01L 24/05; H01L 24/85; H01L 25/18; H01L 24/45; H01L 24/78; H01L 2224/02141; H01L 2224/04042; H01L 2224/05541; H01L 2224/05553; H01L 2224/05558; H01L 2224/48106; H01L 2224/48145; H01L 2224/4846; H01L 2224/48464; H01L 2224/48479; H01L 2224/48482; H01L 2224/85051
USPC ......................................... 257/777, 781, 784
See application file for complete search history.

(56) References Cited

U.S. PATENT DOCUMENTS 6,429,675 B2 8/2002 Bell
9,129,846 B2 * 9/2015 Song ....................... H01L 25/50
(Continued)

*Primary Examiner* — Jasmine J Clark
(74) *Attorney, Agent, or Firm* — WILLIAM PARK & ASSOCIATES LTD.

(57) ABSTRACT

A semiconductor package may include: a base layer; first to Nth semiconductor chips (N is a natural number of 2 or more) sequentially offset stacked over the base layer so that a chip pad portion of one side edge region is exposed, wherein the chip pad portion includes a chip pad and includes a redistribution pad that partially contacts the chip pad and extends away from the chip pad; and a bonding wire connecting the chip pad of a kth semiconductor chip among the first to Nth semiconductor chips to the redistribution pad of a k−1th semiconductor chip or a k+1th semiconductor chip when k is a natural number greater than 1 and the bonding wire connecting the chip pad of the kth semiconductor chip to a pad of the base layer or the redistribution pad of the k+1th semiconductor chip when k is 1.

20 Claims, 18 Drawing Sheets

(52) U.S. Cl.
CPC ............... *H01L 2224/48465* (2013.01); *H01L 2224/48479* (2013.01); *H01L 2224/48482* (2013.01); *H01L 2224/49112* (2013.01); *H01L 2224/85051* (2013.01)

(56) References Cited

U.S. PATENT DOCUMENTS

| | | | |
|---|---|---|---|
| 11,664,351 B2 * | 5/2023 | Do | ...................... H01L 25/0657 257/777 |
| 2010/0109141 A1 * | 5/2010 | Nishiyama | .............. H01L 24/49 257/E23.141 |
| 2022/0068887 A1 | 3/2022 | Chung et al. | |

* cited by examiner

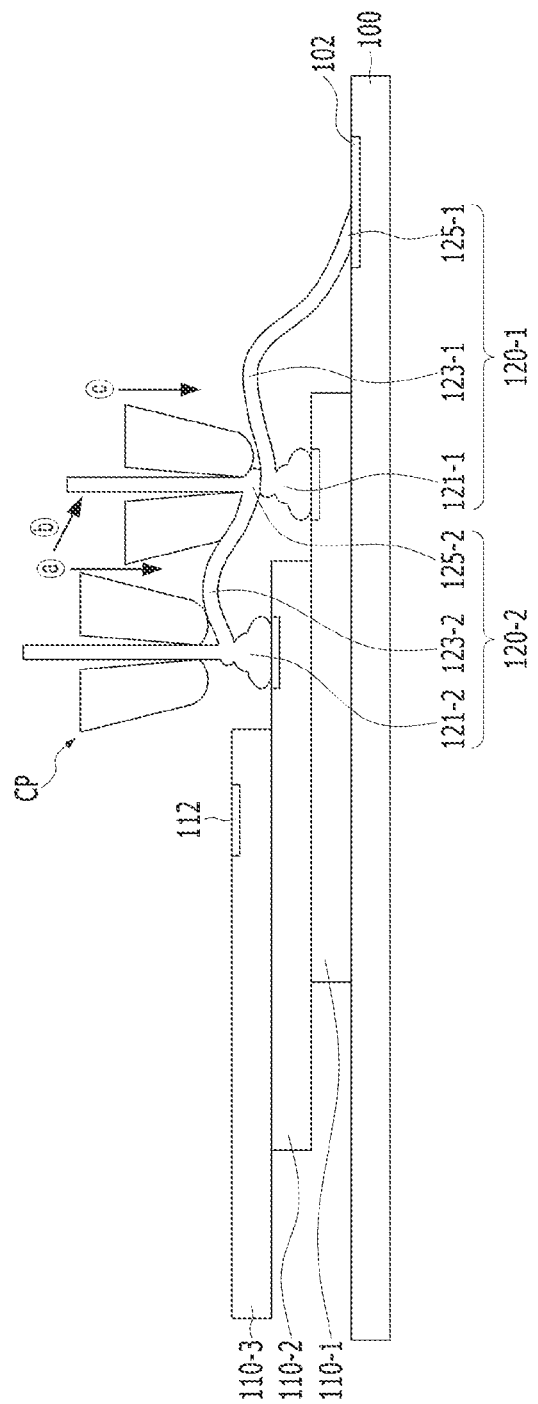

SEMICONDUCTOR PACKAGE INCLUDING STACKED SEMICONDUCTOR CHIPS

CROSS-REFERENCE TO RELATED APPLICATION

This application is a continuation application of U.S. patent application Ser. No. 17/222,505, filed on Apr. 5, 2021, and claims priority under 35 U.S.C. § 119(a) to Korean Patent Application No. 10-2020-0176646 filed on Dec. 16, 2020, in the Korean Intellectual Property Office which is incorporated herein by reference in its entirety.

BACKGROUND

1. Technical Field

This patent document relates to a semiconductor package, and more particularly, to a semiconductor package including a plurality of semiconductor chips which are stacked in a vertical direction.

2. Related Art

Electronic products require high-volume data processing while their sizes are getting smaller. Accordingly, there is a growing need to increase the degree of integration of semiconductor devices used in such electronic products.

However, due to the limitation of semiconductor integration technology, it is difficult to satisfy a required function with only a single semiconductor chip, and thus a semiconductor package in which a plurality of semiconductor chips are embedded has been manufactured.

The plurality of semiconductor chips may be stacked in a vertical direction, and may be electrically connected to each other by bonding wires.

SUMMARY

In an embodiment, a semiconductor package may include: a base layer; first to Nth semiconductor chips, N being a natural number of 2 or more, sequentially offset stacked over the base layer so that a chip pad portion of one side edge region is exposed, wherein the chip pad portion includes a chip pad and includes a redistribution pad that partially contacts the chip pad and extends away from the chip pad; and a bonding wire connecting the chip pad of a kth semiconductor chip among the first to Nth semiconductor chips to the redistribution pad of a k−1th semiconductor chip or a k+1th semiconductor chip when k is a natural number greater than 1 and the bonding wire connecting the chip pad of the kth semiconductor chip to a pad of the base layer or the redistribution pad of the k+1th semiconductor chip when k is 1.

In another embodiment, a method for fabricating a semiconductor package may include: forming a base layer; forming first to Nth semiconductor chips over the base layer, N being a natural number of 2 or more, the first to Nth semiconductor chips being sequentially offset stacked so that a chip pad portion of one side edge region is exposed, wherein the chip pad portion includes a chip pad and includes a redistribution pad that partially contacts the chip pad and extends away from the chip pad; and forming a bonding wire which connects the chip pad of a kth semiconductor chip among the first to Nth semiconductor chips to the redistribution pad of a k−1th semiconductor chip or a k+1th semiconductor chip when k is a natural number greater than 1 and connects the chip pad of the kth semiconductor chip to a pad of the base layer or the redistribution pad of the k+1th semiconductor chip when k is 1.

BRIEF DESCRIPTION OF THE DRAWINGS

FIGS. 2A to 2C are cross-sectional views illustrating an example of a method of forming a bonding wire in the semiconductor package according to the comparative example.

DETAILED DESCRIPTION

Figure 1A:
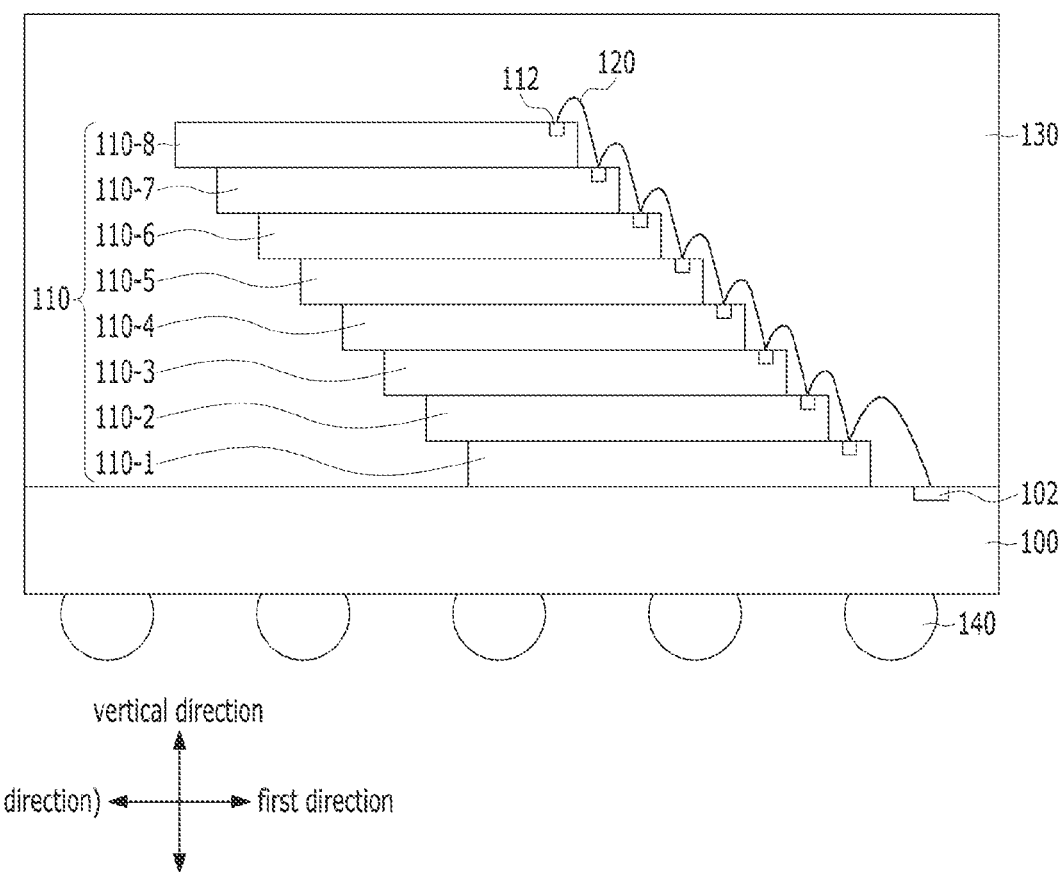
FIG. 1A is a cross-sectional view illustrating a semiconductor package of a comparative example.

Hereinafter, various embodiments of the disclosure will be described in detail with reference to the accompanying drawings.

The drawings are not necessarily drawn to scale. In some instances, proportions of at least some structures in the drawings may have been exaggerated in order to clearly illustrate certain features of the described embodiments. In presenting a specific example in a drawing or description with two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure might not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

Prior to description of the present embodiments, a semiconductor package of a comparative example, a method of forming a bonding wire in the semiconductor package of the comparative example, and its problems will be described.

Figure 1B:
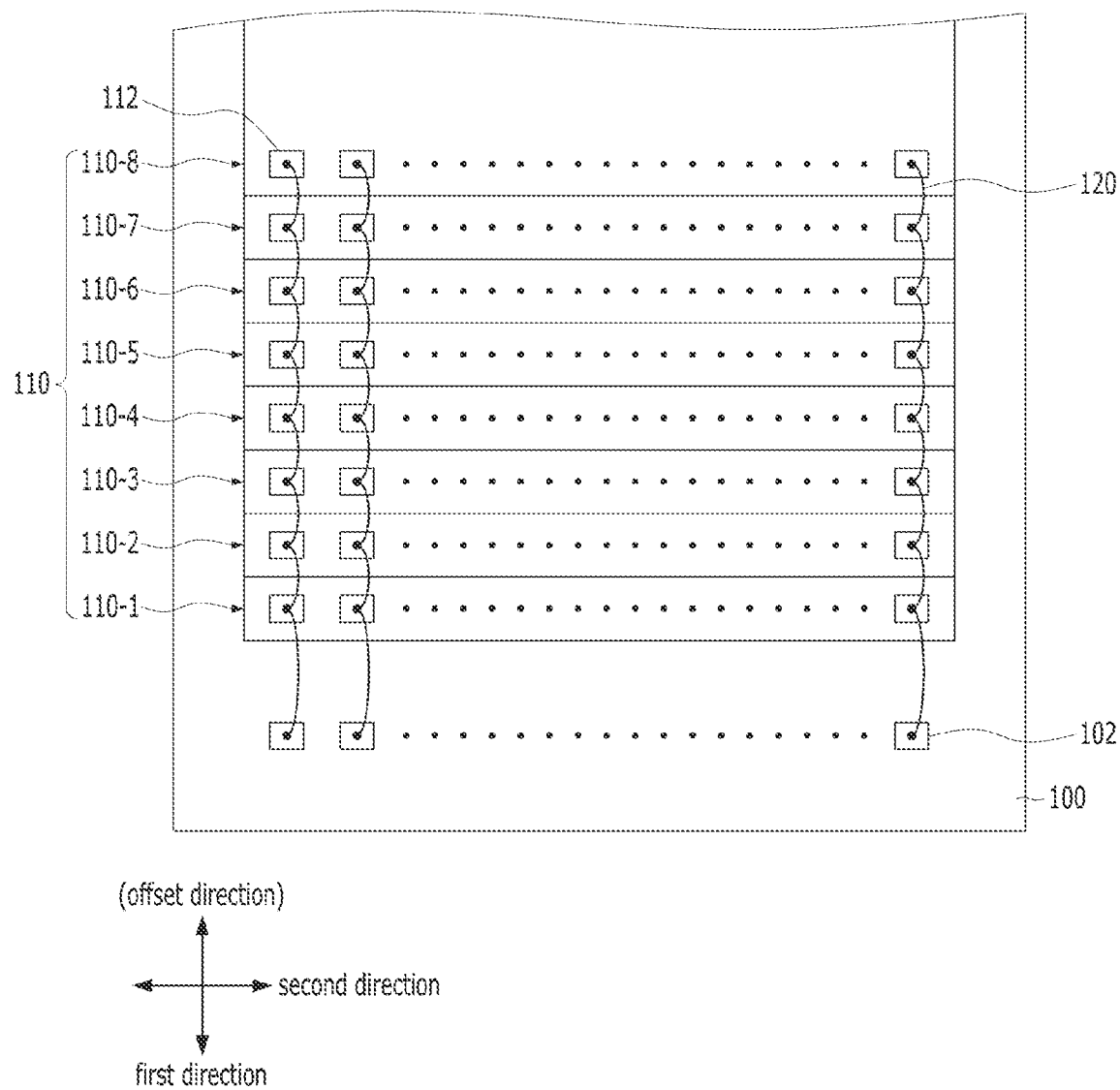
FIG. 1B is a plan view of a part of the semiconductor package of FIG. 1A, viewed from the top.

FIG. 1A is a cross-sectional view illustrating a semiconductor package of a comparative example, and FIG. 1B is a plan view of a part of the semiconductor package of FIG. 1A, viewed from the top.

Referring to FIGS. 1A and 1B, the semiconductor package of the comparative example may include a base layer 100, a chip stack 110, a molding layer 130, and an external connection electrode 140.

The base layer 100 may be a layer with a circuit and/or wiring structure (not shown) for electrically connecting the chip stack 110 to an external component of the semiconductor package. For example, the base layer 100 may include a substrate, such as a printed circuit board (PCB), an interposer, a redistribution layer, or the like. Alternatively, when the chip stack 110 includes memory chips, the base layer 100 may be a semiconductor chip with a logic circuit that supports operations of the memory chips, for example, reading data from the memory chips or writing data to the memory chips.

The base layer 100 may have one surface on which the chip stack 110 is disposed, for example, an upper surface and the other surface on which the external connection electrode 140 is disposed, for example, a lower surface. A pad 102 for electrical connection with the chip stack 110 may be disposed on the upper surface of the base layer 100. The pad 102 may be part of the circuit and/or wiring structure of the base layer 100. Further, although not shown, various pads for electrical connection between the base layer 100 and other components, such as the external connection electrode 140, may be further disposed on the upper and/or lower surfaces of the base layer 100.

The chip stack 110 may include a plurality of semiconductor chips 110-1 to 110-8 that are stacked in a vertical direction over the one surface of the base layer 100. In this comparative example, the chip stack 110 includes eight semiconductor chips 110-1 to 110-8, but the number of semiconductor chips that are included in the chip stack 110 may be modified in various ways. For convenience of description, the plurality of semiconductor chips 110-1 to 110-8 will be referred to as a first semiconductor chip 110-1, a second semiconductor chip 110-2, a third semiconductor chip 110-3, a fourth semiconductor chip 110-4, a fifth semiconductor chip 110-5, a sixth semiconductor chip 110-6, a seventh semiconductor chip 110-7, and an eighth semiconductor chip 110-8, based on the distance from the base layer 100. The first to eighth semiconductor chips 110-1 to 110-8 may be the same memory chip, for example, a NAND flash memory chip. However, the present disclosure is not limited thereto, and the first to eighth semiconductor chips 110-1 to 110-8 may be semiconductor chips of various types and functions.

A plurality of chip pads 112 may be disposed on an upper surface of each of the first to eighth semiconductor chips 110-1 to 110-8. The plurality of chip pads 112 may be disposed at one side edge region of each of the first to eighth semiconductor chips 110-1 to 110-8 in a first direction. The first to eighth semiconductor chips 110-1 to 110-8 may be stacked so that the upper surface on which the chip pads 112 are disposed faces upward and a lower surface faces the base layer 100, that is, in a face-up type. In this case, the first to eighth semiconductor chips 110-1 to 110-8 may be offset stacked in a direction from one side that is adjacent to the chip pads 112 in the first direction toward the other side that is located opposite to the one side in the first direction, so that all the chip pads 112 of each of the first to eighth semiconductor chips 110-1 to 110-8 may be exposed. In a second direction crossing the first direction, one side of each of the first to eighth semiconductor chips 110-1 to 110-8 may be substantially aligned with each other, and the other side of each of the first to eighth semiconductor chips 110-1 to 110-8 may be substantially aligned with each other.

In each of the first to eighth semiconductor chips 110-1 to 110-8, the plurality of chip pads 112 may be arranged in a line along the second direction. The chip pads 112 of the first to eighth semiconductor chips 110-1 to 110-8, corresponding to each other (for example, the chip pads 112 substantially aligned with each other along the first direction), may be connected to each other by the bonding wire 120 and may be connected to the pad 102 of the base layer 100. Accordingly, they may function as a terminal to receive power from the base layer 100 or exchange signals with the base layer 100.

The molding layer 130 may cover the chip stack 110 over the upper surface of the base layer 100. The molding layer 130 may include various molding materials, such as EMC (Epoxy Molding Compound).

The external connection electrode 140 may be formed over the lower surface of the base layer 100 and may function to connect to the external component of the semiconductor package. The external connection electrode 140 may include various interconnectors, such as solder balls.

In the above semiconductor package, a method of forming the bonding wire 120 will be described in more detail with reference to FIGS. 2A to 3E below.

Figure 2A:
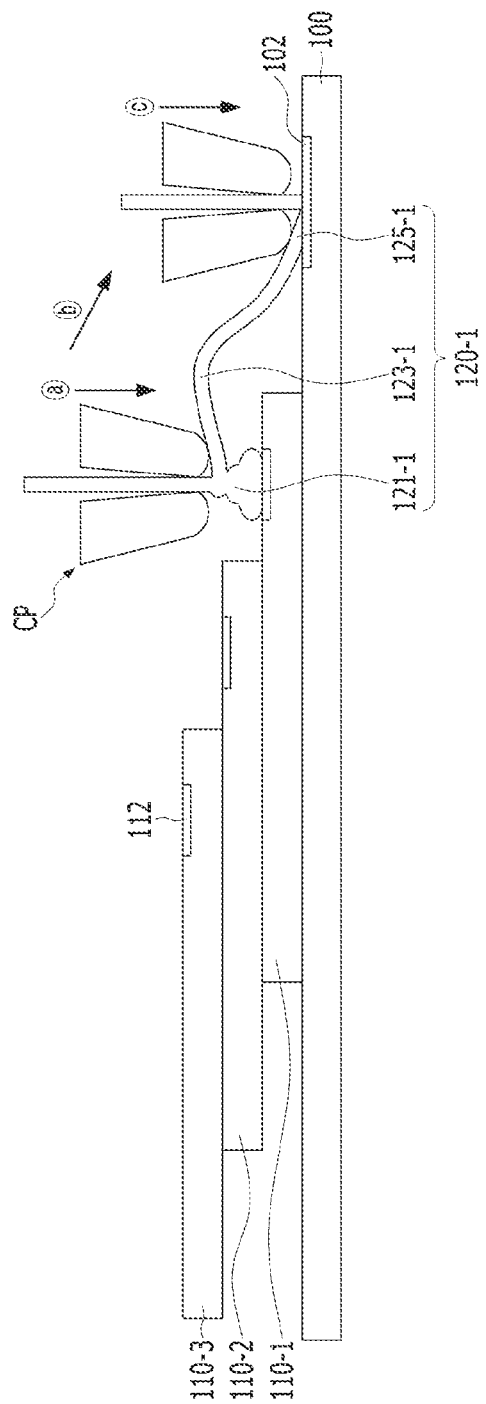
Figure 2C:
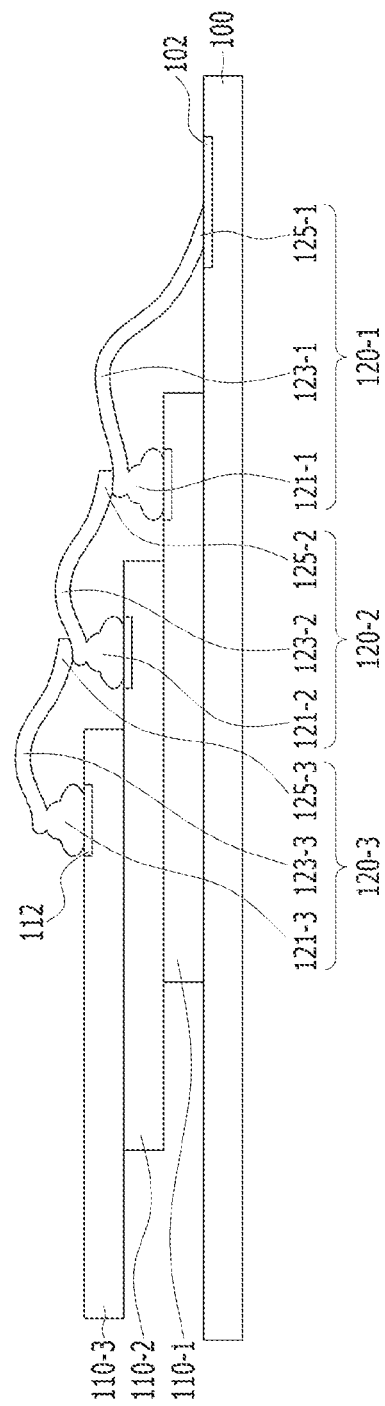

FIGS. 2A to 2C are cross-sectional views illustrating an example of a method of forming a bonding wire in the semiconductor package according to the comparative example. For convenience of description, only a part of the semiconductor package of the comparative example, that is, a part of the base layer 100 and the first to third semiconductor chips 110-1 to 110-3, are illustrated.

Referring to FIG. 2A, a first bonding wire 120-1 that connects the chip pad 112 of the first semiconductor chip 110-1 to the pad 102 of the base layer 100 may be formed by using a capillary CP that performs a wire bonding process.

More specifically, first, the capillary CP may move over the chip pad 112 of the first semiconductor chip 110-1 to perform ball bonding, and thus, a first ball bump 121-1 that is bonded to the chip pad 112 of the first semiconductor chip 110-1 may be formed (see ⓐ).

Subsequently, while the capillary CP moves in a direction toward the pad 102 of the base layer 100, a first wire loop 123-1 that extends from the first ball bump 121-1 may be formed (see ⓑ).

Subsequently, the capillary CP may move over the pad 102 of the base layer 100 to perform stitch bonding, and thus, a first bonding portion 125-1 that is bonded to the pad 102 of the base layer 100 may be formed (see ⓒ).

As a result, the first bonding wire 120-1 with the first ball bump 121-1, the first wire loop 123-1, and the first bonding portion 125-1 may be formed.

Referring to FIG. 2B, a second bonding wire 120-2 that connects the chip pad 112 of the second semiconductor chip 110-2 to the chip pad 112 of the first semiconductor chip 110-1 may be formed. The method of forming the second bonding wire 120-2 may be substantially the same as the method of forming the first bonding wire 120-1.

More specifically, first, the capillary CP may move over the chip pad 112 of the second semiconductor chip 110-2 to perform ball bonding, and thus, a second ball bump 121-2 that is bonded to the chip pad 112 of the second semiconductor chip 110-2 may be formed (see ⓐ).

Subsequently, while the capillary CP moves in a direction toward the chip pad 112 of the first semiconductor chip 110-1, a second wire loop 123-2 that extends from the second ball bump 121-2 may be formed (see ⓑ).

Subsequently, the capillary CP may move over the chip pad 112 of the first semiconductor chip 110-1 to perform stitch bonding, and thus, a second bonding portion 125-2 may be formed (see ⓒ). At this time, because a part of the first bonding wire 120-1, in particular, the first ball bump 121-1, exists over the chip pad 112 of the first semiconductor chip 110-1, the second bonding portion 125-2 may be bonded on the first ball bump 121-1.

As a result, the second bonding wire 120-2 with the second ball bump 121-2, the second wire loop 123-2, and the second bonding portion 125-2 may be formed. The method of forming the second bonding wire 120-2 may be referred to as a forward bonding method.

Referring to FIG. 2C, a third bonding wire 120-3 that connects the chip pad 112 of the third semiconductor chip 110-3 to the chip pad 112 of the second semiconductor chip 110-2 may be formed by substantially the same process as described in FIG. 2B. The third bonding wire 120-3 may include a third ball bump 121-3, a third wire loop 123-3, and a third bonding portion 125-3.

Although not illustrated, bonding wires that connect a plurality of semiconductor chips that are stacked over the third semiconductor chip 110-3 may be formed by repeating substantially the same process as described in FIG. 2B. For reference, the bonding wire may include metals, such as gold, silver, copper, platinum, or an alloy thereof that is capable of bonding to the chip pad 112.

However, the bonding wire forming method described in FIGS. 2A to 2C, that is, the forward bonding method, may be difficult to use when the size and pitch of the chip pad 112 is small. When the size and pitch of the chip pad 112 is small, it may be necessary to use a thin wire, and for this purpose, a capillary with a small diameter tip, such as a bottleneck capillary, may be used. In this case, the contact area between the bonding wires, for example, the contact area between the second bonding portion 125-2 of the second bonding wire 120-2 and the first ball bump 121-1 of the first bonding wire 120-1 may be relatively small. In other words, when the size and pitch of the chip pad 112 is small and a capillary with a small diameter tip corresponding thereto is used, the bonding force at the contact portion between the bonding wires may decrease, resulting in poor connection therebetween.

FIGS. 3A to 3E are cross-sectional views illustrating another example of a method of forming a bonding wire in the semiconductor package according to the comparative example.

Figure 3A:
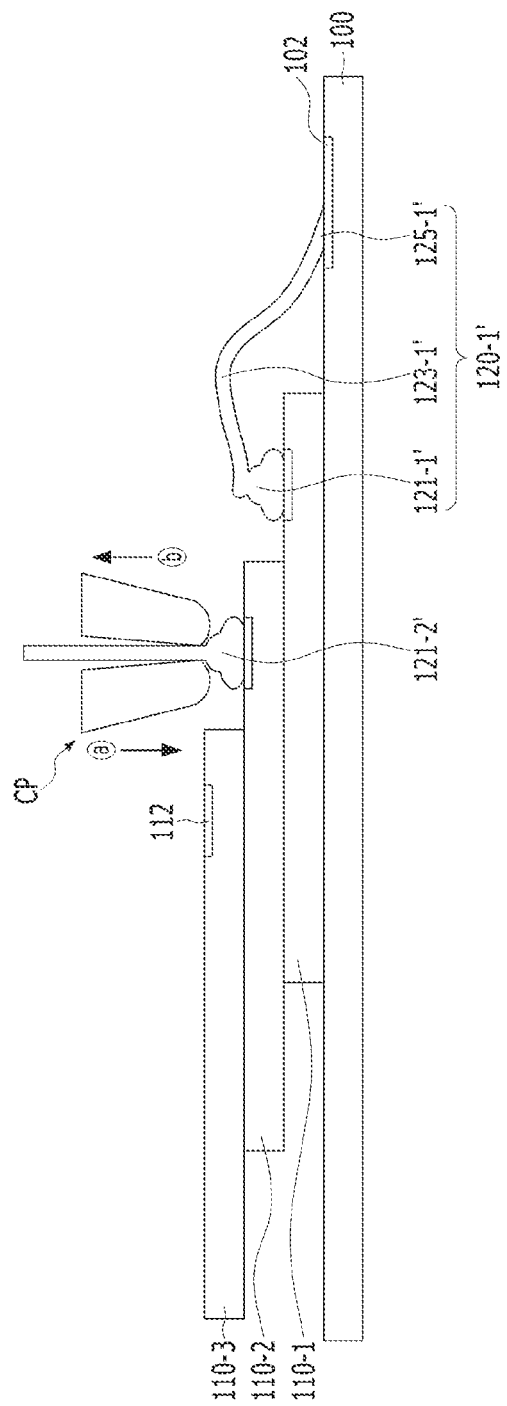
FIGS. 3A to 3E are cross-sectional views illustrating another example of a method of forming a bonding wire in the semiconductor package according to the comparative example.

Referring to FIG. 3A, a first bonding wire 120-1' that connects the chip pad 112 of the first semiconductor chip 110-1 to the pad 102 of the base layer 100 may be formed by performing substantially the same process as the process of FIG. 2A. The first bonding wire 120-1' may include a first ball bump 121-1', a first wire loop 123-1', and a first bonding portion 125-1'.

Subsequently, the capillary CP may move over the chip pad 112 of the second semiconductor chip 110-2 to perform ball bonding, and thus, a second ball bump 121-2' that is bonded to the chip pad 112 of the second semiconductor chip 110-2 may be formed (see ⓐ).

Subsequently, the capillary CP may cut the wire on the second ball bump 121-2' so that only the second ball bump 121-2' exists over the chip pad 112 of the second semiconductor chip 110-2. The cutting of the wire may be performed by moving the capillary CP in the upward direction (see ⓑ).

Figure 3B:
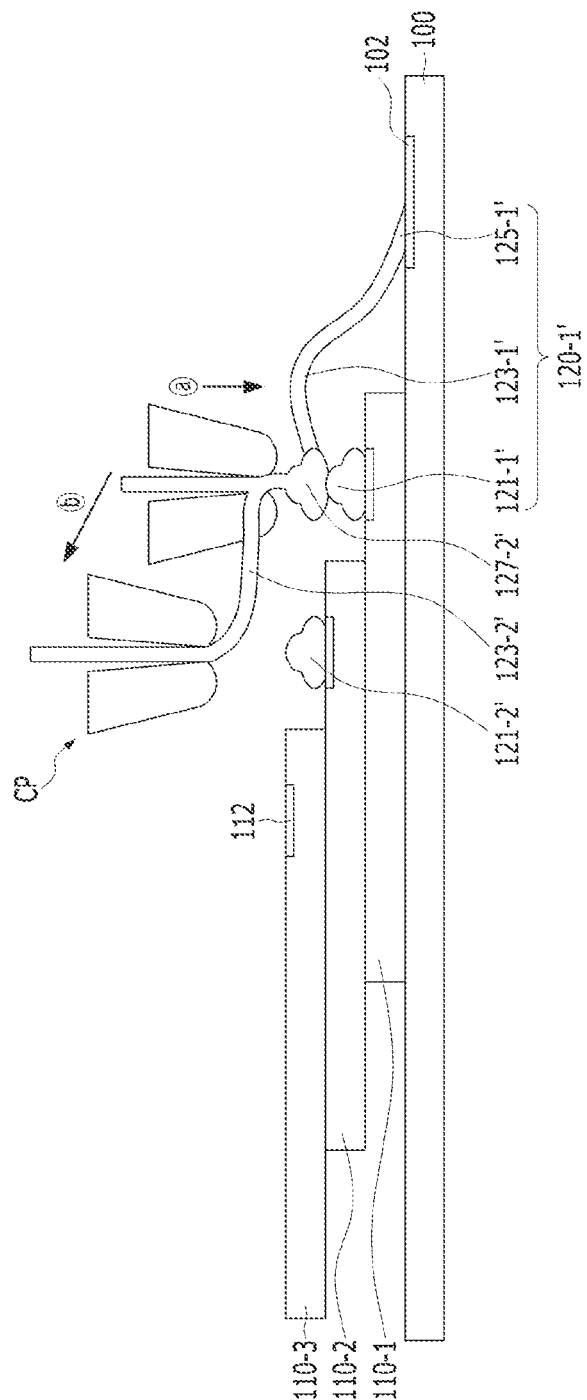

Referring to FIG. 3B, the capillary CP may move over the chip pad 112 of the first semiconductor chip 110-1 to perform ball bonding, and thus, an additional second ball bump 127-2' may be formed (see ⓐ). At this time, because the first ball bump 121-1' exists over the chip pad 112 of the first semiconductor chip 110-1, the additional second ball bump 127-2' may be bonded on the first ball bump 121-1'. Because the additional second ball bump 127-2' has a relatively large volume compared to a bonding portion that is formed by stitch bonding, the contact area with the first ball bump 121-1' may increase, and thus, bonding may be advantageous. For reference, during such bonding, a part of the first wire loop 123-1' on the first ball bump 121-1' may be integrated with the additional second ball bump 127-2'. As a result, the first wire loop 123-1' may extend from the additional second ball bump 127-2'.

Subsequently, while the capillary CP moves in the direction toward the chip pad 112 of the second semiconductor chip 110-2, a second wire loop 123-2' that extends from the additional second ball bump 127-2' may be formed (see ⓑ).

Figure 3C:
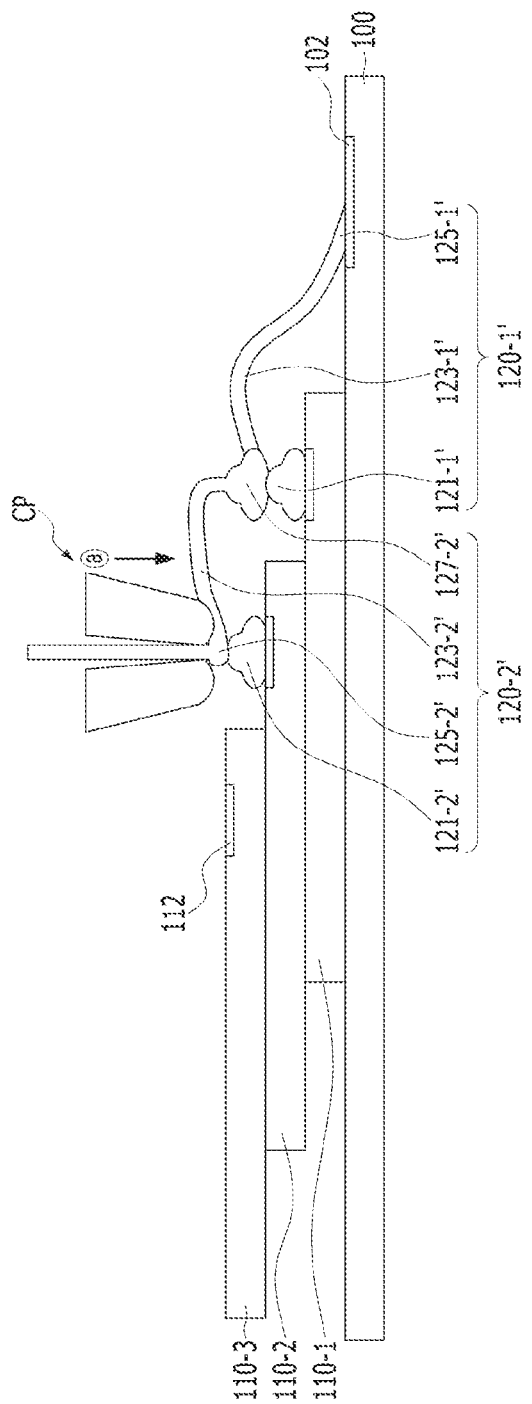

Referring to FIG. 3C, the capillary CP may move over the chip pad 112 of the second semiconductor chip 110-2 to perform stitch bonding, a second bonding portion 125-2' may be formed (see ⓐ). At this time, because the second ball bump 121-2' exists on the chip pad 112 of the second semiconductor chip 110-2, the second bonding portion 125-2' may be bonded on the second ball bump 121-2'.

As a result, a second bonding wire 120-2' with the second ball bump 121-2', the second wire loop 123-2', the second bonding portion 125-2', and the additional second ball bump 127-2' may be formed. The method of forming the second bonding wire 120-2' may be referred to as a reverse bonding method.

A third bonding wire 120-3' may also be formed by substantially the same process as described in FIGS. 3B and 3C.

Figure 3D:
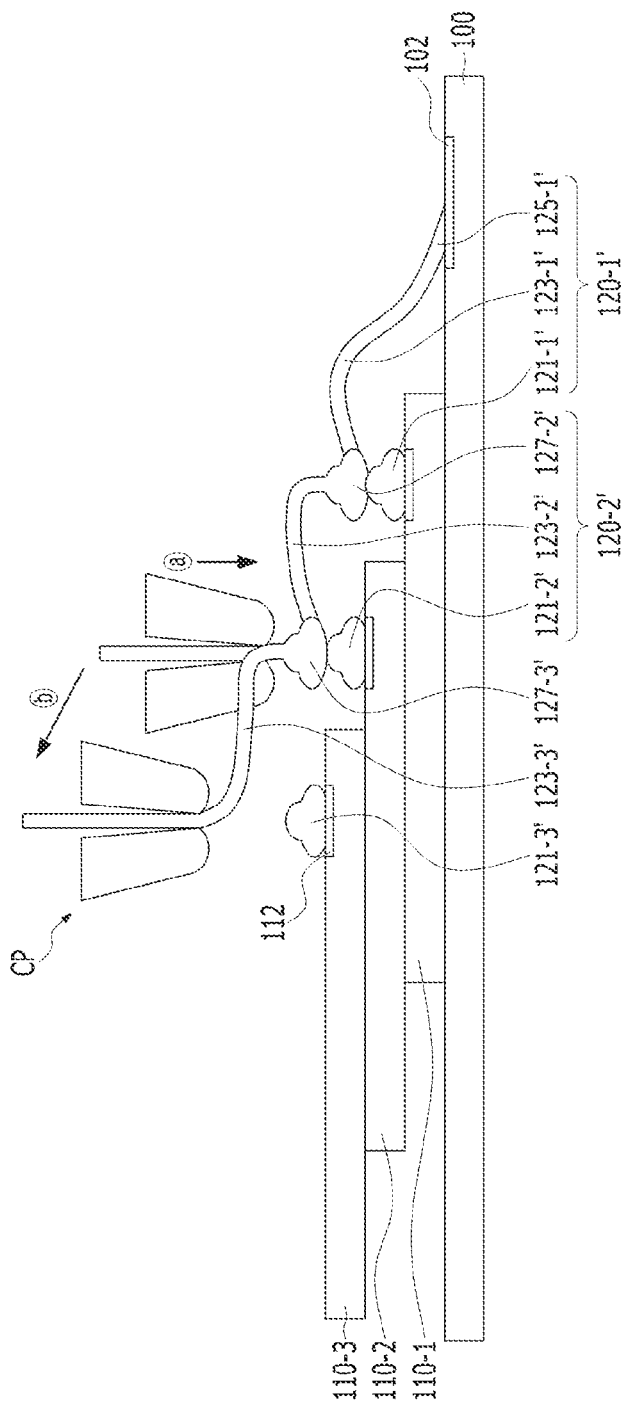

Referring to FIG. 3D, a third ball bump 121-3' that is bonded to the chip pad 112 of the third semiconductor chip 110-3 may be formed.

Subsequently, the capillary CP may move over the chip pad 112 of the second semiconductor chip 110-2 to perform ball bonding, and thus, an additional third ball bump 127-3' that is bonded on the second ball bump 121-2' may be formed (see ⓐ).

Subsequently, while the capillary CP moves in a direction toward the chip pad 112 of the third semiconductor chip 110-3, a third wire loop 123-3' that extends from the additional third ball bump 127-3' may be formed (see ⓑ).

Figure 3E:
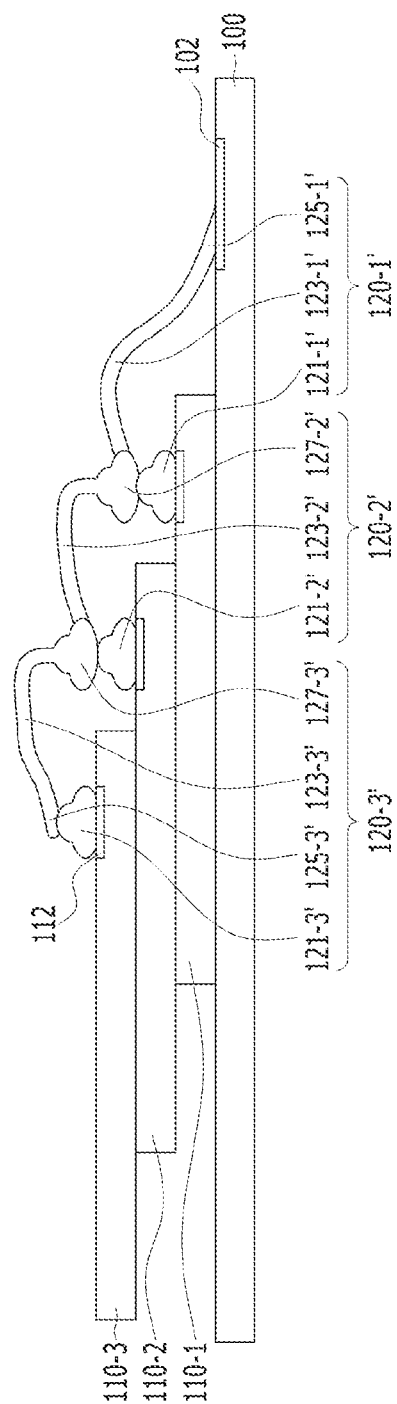

Referring to FIG. 3E, one end of the third wire loop 123-3' may be stitch-bonded, and thus, a third bonding portion 125-3' that is bonded on the third ball bump 121-3' may be formed.

As a result, the third bonding wire 120-3' with the third ball bump 121-3', the third wire loop 123-3', the third bonding portion 125-3', and the additional third ball bump 127-3' may be formed.

Although not illustrated, bonding wires that connect a plurality of semiconductor chips additionally stacked over the third semiconductor chip 110-3 may be formed by repeating substantially the same process as described in FIGS. 3B and 3C.

In the case of the bonding wire forming method described in FIGS. 3A to 3D, that is, the reverse bonding method, the contact area between the bonding wires, for example, the contact area between the additional second ball bump 127-2' of the second bonding wire 120-2' and the first ball bump 121-1' of the first bonding wire 120-1' may increase.

However, even in this case, multiple bonding stresses may be applied to one chip pad 112. For example, ball bonding for forming the second ball bump 121-2', stitch bonding for forming the second bonding portion 125-2', and ball bonding for forming the additional third ball bump 127-3' may be performed to the chip pad 112 of the second semiconductor chip 110-2. That is, three bonding stresses may be applied to the chip pad 112 of the second semiconductor chip 110-2. Such bonding stress may cause a poor connection between the chip pad 112 and the bonding wire.

In the present disclosure, a semiconductor package including a chip pad portion with a new structure and a method of forming a bonding wire in the semiconductor package may be provided so as to solve the problems of the above comparative example.

Figure 4A:
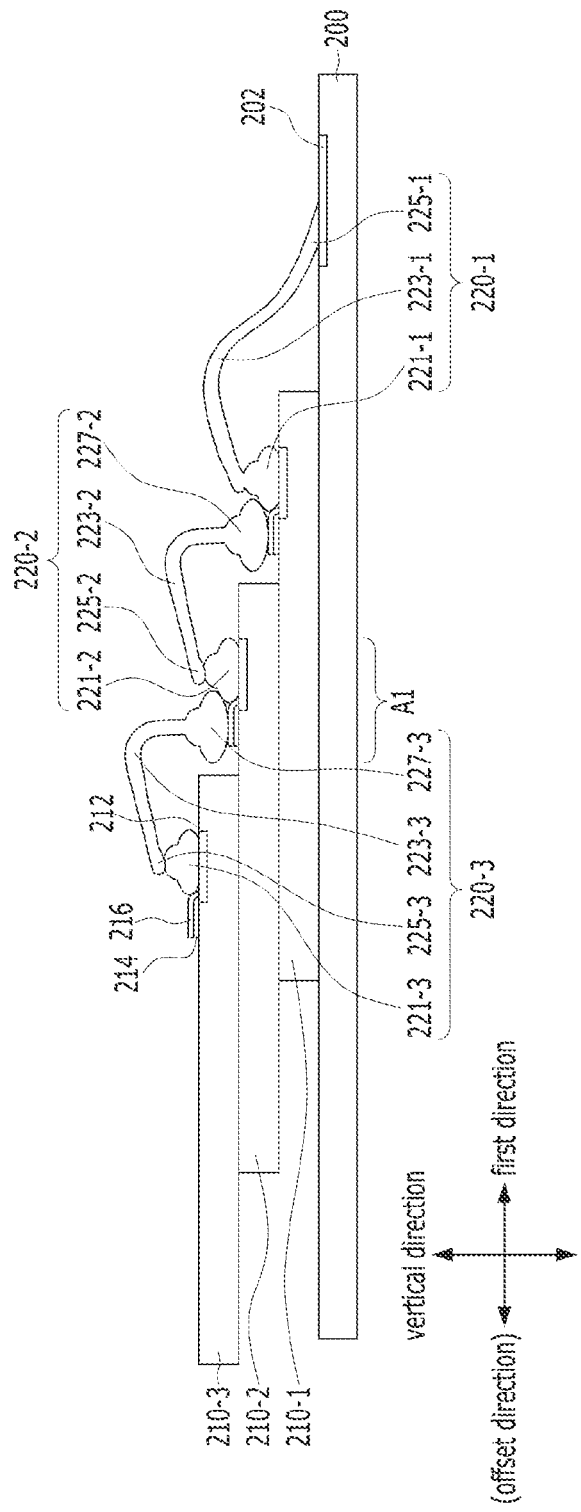
FIG. 4A is a cross-sectional view illustrating a semiconductor package according to an embodiment of the present disclosure.
Figure 4B:
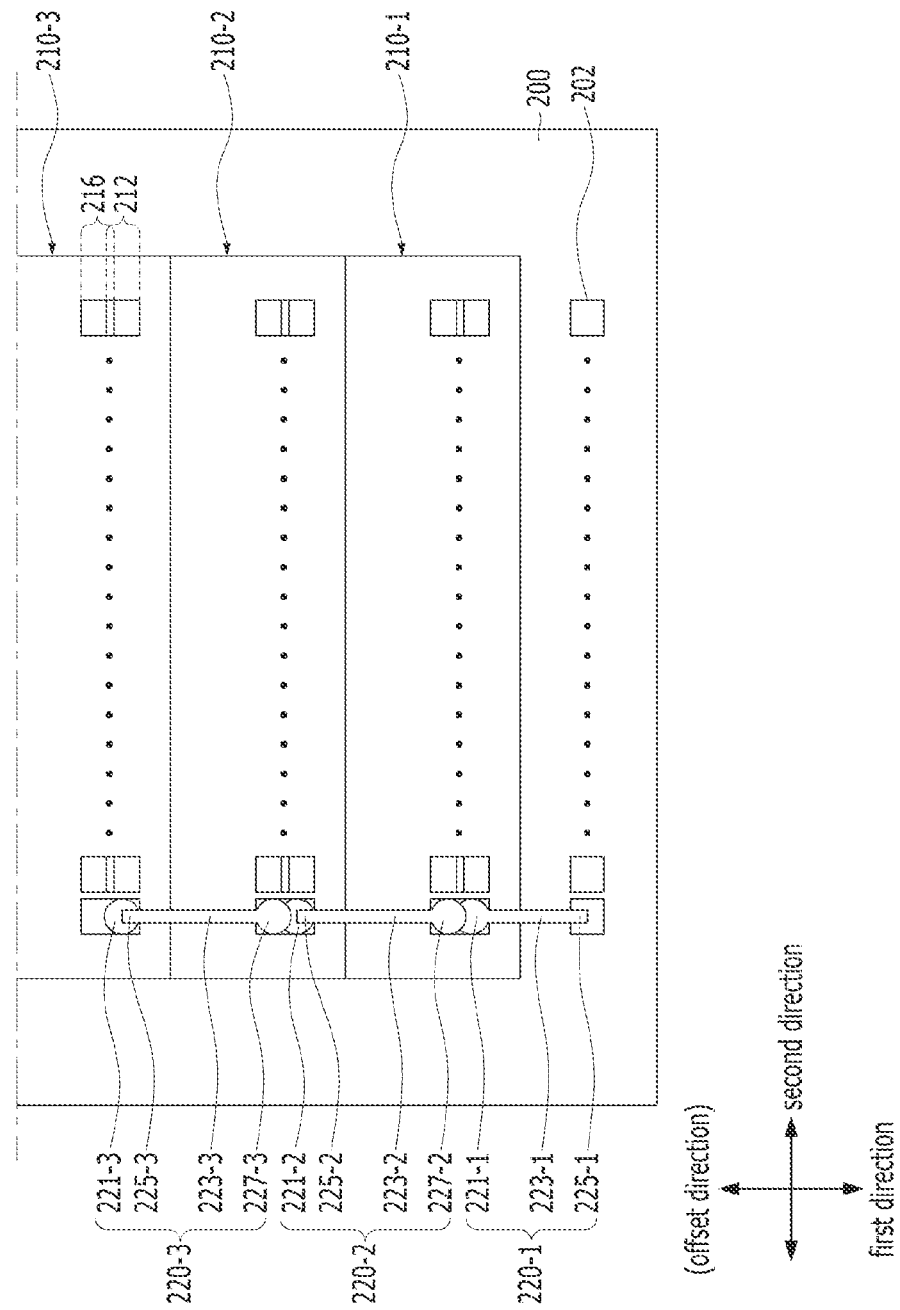
FIG. 4B is a plan view of the semiconductor package of FIG. 4A, viewed from the top.
Figure 4C:
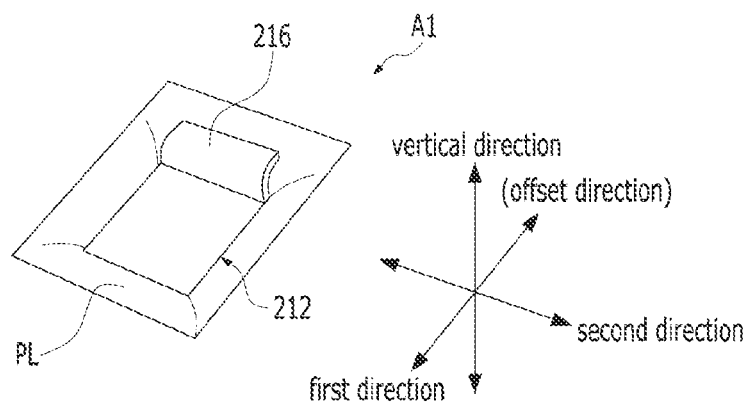
FIG. 4C is an enlarged perspective view illustrating a chip pad portion of the semiconductor package of FIG. 4A.
Figure 4D:
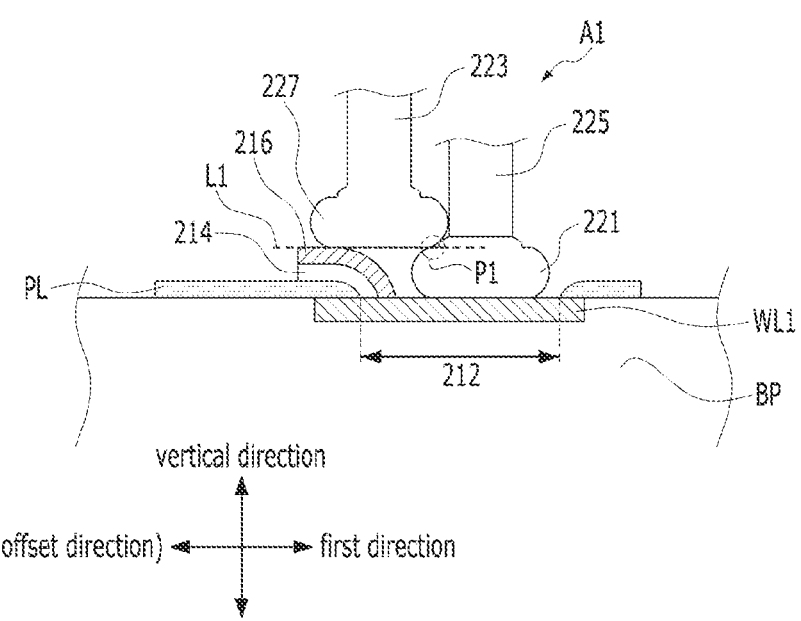
FIG. 4D is an enlarged cross-sectional view illustrating a chip pad portion and a bonding wire that is connected to the chip pad portion of the semiconductor package of FIG. 4A.

FIG. 4A is a cross-sectional view illustrating a semiconductor package according to an embodiment of the present disclosure, and FIG. 4B is a plan view of the semiconductor package of FIG. 4A, viewed from the top. FIG. 4C is an enlarged perspective view illustrating a chip pad portion of the semiconductor package of FIG. 4A, and FIG. 4D is an enlarged cross-sectional view illustrating a chip pad portion and a bonding wire that is connected to the chip pad portion of the semiconductor package of FIG. 4A. In FIGS. 4A and 4B, for convenience of description, only a base layer and three semiconductor chips stacked over one surface of the base layer are illustrated. However, similar to that shown in FIGS. 1A and 1B, the semiconductor package of the present embodiment may include a plurality of, for example, eight semiconductor chips stacked over the one surface of the base layer, a molding layer covering the plurality of semiconductor chips, and an external connection electrode formed over the other surface of the base layer.

First, referring to FIGS. 4A and 4B, the semiconductor package of the present embodiment may include a base layer 200, first to third semiconductor chips 210-1 to 210-3 stacked over one surface of the base layer 200, a first bonding wire 220-1 that connects the base layer 200 and the first semiconductor chip 210-1 to each other, a second bonding wire 220-2 that connects the first semiconductor chip 210-1 and the second semiconductor chip 210-2 to each other, and a third bonding wire 220-3 that connects the second semiconductor chip 210-2 and the third semiconductor chip 210-3 to each other.

The base layer 200 may be a layer with a circuit and/or wiring structure (not shown) for electrically connecting the first to third semiconductor chips 210-1 to 210-3 with an external component of the semiconductor package. The base layer 200 may have one surface on which the first to third semiconductor chips 210-1 to 210-3 are disposed, for example, an upper surface, and the other surface on which an external connection electrode (not shown) is disposed, for example, a lower surface. A pad 202 for electrical connection with the first to third semiconductor chips 210-1 to 210-3 may be disposed on the upper surface of the base layer 200. The pad 202 may be a part of the circuit and/or wiring structure of the base layer 200.

The first to third semiconductor chips 210-1 to 210-3 may be stacked over the one surface of the base layer 200 in a vertical direction. As described above, the number of semiconductor chips stacked over the one surface of the base layer 200 in the vertical direction may be modified in various ways.

A plurality of chip pads 212 may be disposed over an upper surface of each of the first to third semiconductor chips 210-1 to 210-3. The plurality of chip pads 212 may be disposed at one side edge region of each of the first to third semiconductor chips 210-1 to 210-3 in a first direction. The first to third semiconductor chips 210-1 to 210-3 may be stacked in a face-up type in which the upper surface on which the chip pads 212 are disposed faces upward and a lower surface faces the base layer 200. At this time, the first to third semiconductor chips 210-1 to 210-3 may be stacked with an offset in a direction from one side that is adjacent to the chip pads 212 in the first direction toward the other side that is located opposite to the one side in the first direction so that all the chip pads 212 of each of the first to third semiconductor chips 210-1 to 210-3 are exposed. Hereinafter, this direction will be referred to as an offset direction. In a second direction that crosses the first direction, one side of each of the first to third semiconductor chips 210-1 to 210-3 may be substantially aligned with each other, and the other side of each of the first to third semiconductor chips 210-1 to 210-3 may be substantially aligned with each other.

In each of the first to third semiconductor chips 210-1 to 210-3, a plurality of chip pads 212 may be arranged in a line along the second direction. The chip pads 212 of the first to third semiconductor chips 210-1 to 210-3, which correspond to each other, for example, the chip pads 212 substantially aligned with each other along the first direction, may be connected to each other by bonding wires 220-1, 220-2, and 220-3, and may be connected to the pad 202 of the base layer 200, and accordingly, they may function as a terminal for receiving power from the base layer 200 or exchanging signals with the base layer 200.

Further, on the upper surface of each of the first to third semiconductor chips 210-1 to 210-3, a redistribution pad 216 that partially contacts each of the plurality of chip pads 212 and extends to the outside of the chip pad 212 may be disposed. A chip pad portion (see A1) with the chip pad 212 and the redistribution pad 216 in contact with the chip pad 212 will be described in detail below with reference to FIGS. 4C and 4D.

Referring to FIGS. 4C and 4D, the chip pad portion A1 may include the chip pad 212 that is defined by a passivation layer PL, and a stacked structure of an insulating pattern 214 and the redistribution pad 216, which is in contact with the chip pad 212 and extends from the chip pad 212.

For reference, although not shown in detail in the cross-sectional view of FIG. 4A, each semiconductor chip may include a body portion BP with various wiring structures and the passivation layer PL that covers an upper surface of the body portion BP. For convenience of description, only a wiring layer WL1 of the wiring structure of the body portion BP, which is located at the top of the body portion BP and has an upper surface that is located at the same level as the upper surface of the body portion BP, is shown in FIG. 4D. The passivation layer PL may have an opening that exposes a part of the wiring layer WL1, and the part of the wiring layer WL1 that is exposed by the opening of the passivation layer PL may correspond to the chip pad 212.

The passivation layer PL may include an insulating material. The passivation layer PL may include various polymer-based insulating materials, such as polyimide-iso-indroquinazalinedione (PIQ). An upper surface of the passivation layer PL may be positioned above the upper surface of the body portion BP and the upper surface of the chip pad 212, and a side surface of the passivation layer PL that is adjacent to the opening may have an inclined shape. The opening of the passivation layer PL and the chip pad 212 that is defined by the opening of the passivation layer PL may have a rectangular shape with two sides in the first direction and two sides in the second direction. One side of the chip pad 212 in the first direction may be disposed to face the offset direction, and the other side may be disposed on the opposite side.

The stacked structure of the insulating pattern 214 and the redistribution pad 216 may contact a part of the chip pad 212 and may extend onto the passivation layer PL, which is outside the chip pad 212, along the inclined side surface and the upper surface of the passivation layer PL. In the present embodiment, the stacked structure of the insulating pattern 214 and the redistribution pad 216 may be in contact with a part of the chip pad 212, which is adjacent to the one side that faces the offset direction among the two sides of the chip pad 212 in the first direction, while extending onto the passivation layer PL toward the offset direction. In particular, one end of the redistribution pad 216 may be formed to directly contact the chip pad 212. However, the present disclosure is not limited thereto, a contact portion between the chip pad 212 and the stacked structure of the insulating pattern 214 and the redistribution pad 216, and the extension direction of the stacked structure of the insulating pattern 214 and the redistribution pad 216 may be modified in various ways. As a result, the stacked structure of the insulating pattern 214 and the redistribution pad 216 may have an upper surface positioned above the upper surface of the chip pad 212 and the upper surface of the passivation layer PL. In addition, in a plan view, in the first direction, the redistribution pad 216 and the chip pad 212 may partially overlap.

As an example, the stacked structure of the insulating pattern 214 and the redistribution pad 216 may be formed by depositing an insulating material and a conductive material over the chip pad 112 and the passivation layer PL along its lower profile, and selectively etching the deposited materials. Alternatively, as another example, the stacked structure of the insulating pattern 214 and the redistribution pad 216 may be formed by forming the insulating pattern 214 over the chip pad 212 and the passivation layer PL along its lower profile, forming a photoresist pattern (not shown) with an opening that exposes a region in which the redistribution pad 216 is to be formed, and forming the redistribution pad 216 in the opening using an electroplating method. The photoresist pattern may be removed after the redistribution pad 216 is formed. The insulating pattern 214 may include various insulating materials, such as polyimide or benzocyclobutene (BCB). The redistribution pad 216 may include a metal, such as gold, silver, copper, or platinum, or an alloy thereof.

Although not illustrated, the insulating pattern 214 may be omitted. In this case, the redistribution pads 216 may be formed along the side and upper surfaces of the passivation layer PL to directly contact them, while extending to the chip pad 212. Referring back to FIGS. 4A and 4B, the first bonding wire 220-1 may connect the pad 202 of the base layer 200 and the chip pad 212 of the first semiconductor chip 210-1 to each other. The first bonding wire 220-1 may include a first ball bump 221-1 that is bonded to the chip pad 212 of the first semiconductor chip 210-1, a first bonding portion 225-1 that is bonded to the pad 202 of the base layer 200, and a first wire loop 223-1 that extends between the first ball bump 221-1 and the first bonding portion 225-1.

The second bonding wire 220-2 may connect the redistribution pad 216 of the first semiconductor chip 210-1 and the chip pad 212 of the second semiconductor chip 210-2 to each other. The second bonding wire 220-2 may include a second ball bump 221-2 that is bonded to the chip pad 212 of the second semiconductor chip 210-2, an additional second ball bump 227-2 that is bonded to the redistribution pad 216 of the first semiconductor chip 210-1, a second wire loop 223-2 that extends from the additional second ball bump 227-2 to the second ball bump 221-2, and a second bonding portion 225-2 that is bonded to the second ball bump at one end of the second wire loop 223-2.

The third bonding wire 220-3 may connect the redistribution pad 216 of the second semiconductor chip 210-2 and the chip pad 212 of the third semiconductor chip 210-3 to each other. The third bonding wire 210-3 may include a third ball bump 221-3 that is bonded to the chip pad 212 of the third semiconductor chip 210-3, an additional third ball bump 227-3 that is bonded to the redistribution pad 216 of the second semiconductor chip 210-2, a third wire loop 223-3 that extends from the additional third ball bump 227-3 to the third ball bump 221-3, and a third bonding portion 225-3 that is bonded to the third ball bump 221-3 at one end of the third wire loop 223-3.

As described above, because the upper surface of the redistribution pad 216 is positioned above the upper surface of the chip pad 212, and the redistribution pad 216 extends outside the chip pad 212, the additional second ball bump 227-2, which is bonded to the redistribution pad 216 of the first semiconductor chip 210-1, may only partially contact the first ball bump 221-1, which is bonded to the chip pad 212 of the first semiconductor chip 210-1, and the additional third ball bump 227-3, which is bonded to the redistribution pad 216 of the second semiconductor chip 210-2, may only partially contact the second ball bump 221-2, which is bonded to the chip pad 212 of the second semiconductor chip 210-2. Even if the additional second ball bump 227-2 and the first ball bump 221-1 partially contact each other, the redistribution pad 216 of the first semiconductor chip 210-1 may contact and may be electrically connected to the chip pad 212 of the first semiconductor chip 210-1, and thus, it may be possible to electrically connect the first bonding wire 220-1 to the second bonding wire 220-2. In addition, even if the additional third ball bump 227-3 and the second ball bump 221-2 partially contact each other, the redistribution pad 216 of the second semiconductor chip 210-2 may contact and may be electrically connected to the chip pad 212 of the second semiconductor chip 210-2, and thus, it may be possible to electrically connect the second bonding wire 220-2 to the third bonding wire 220-3. In a plan view, because the chip pad 212 and the redistribution pad 216 partially overlap in the first direction, the first ball bump 221-1 and the additional second ball bump 227-2 may also partially overlap with each other, and the second ball bump 221-2 and the additional third ball bump 227-3 may also partially overlap with each other.

A ball bump and an additional ball bump that are connected to one chip pad portion A1 will be described in more detail with reference to FIG. 4D.

Referring back to FIG. 4D, a ball bump 221 of one bonding wire may be bonded to the chip pad 212 of the chip pad portion A1, and an additional ball bump 227 of another bonding wire may be bonded to the redistribution pad 216 of the chip pad portion A1.

Here, the additional ball bump 227 may contact/bond with the upper surface of the redistribution pad 216 and a part of the ball bump 221 at the same time. In this case, the force applied when bonding the additional ball bump 227 may be distributed to both the redistribution pad 216 and the ball bump 221, and the additional ball bump 227 may be stably supported while not being inclined to one side.

The part of the ball bump 221, which is in contact with the additional ball bump 227, is indicated by reference numeral P1. The upper surface of the redistribution pad 216 and the part P1 of the ball bump 221 may be positioned at substantially the same level (see L1).

Figure 5A:
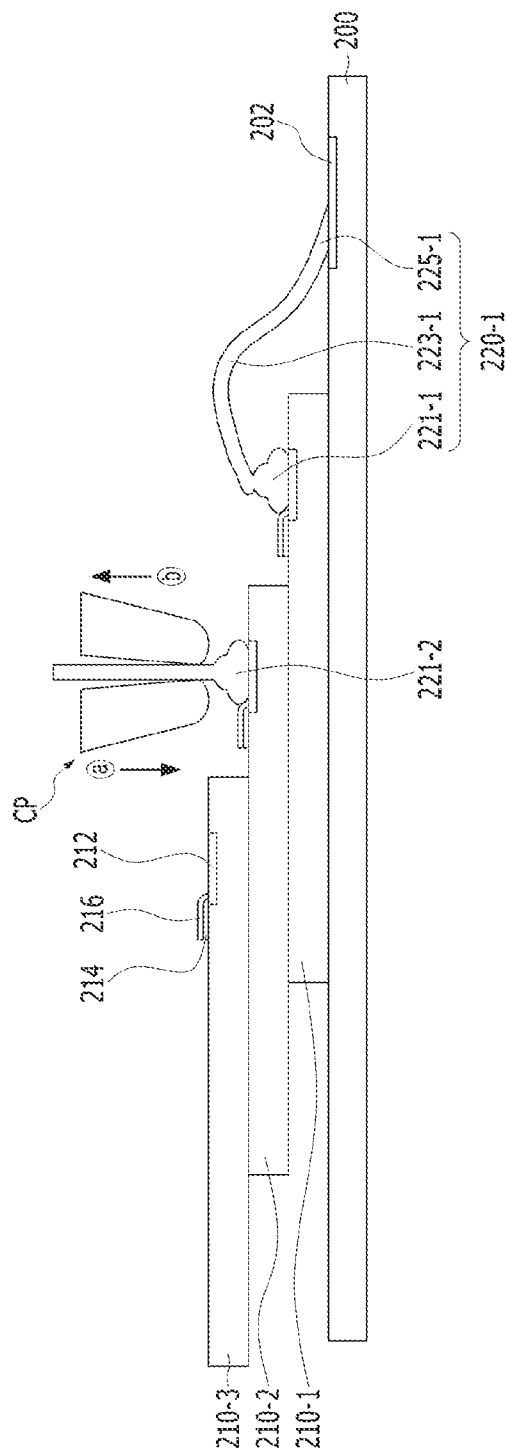
FIGS. 5A and 5B are cross-sectional views illustrating an example of a method of forming a bonding wire in the semiconductor package of FIGS. 4A and 4B.
Figure 5B:
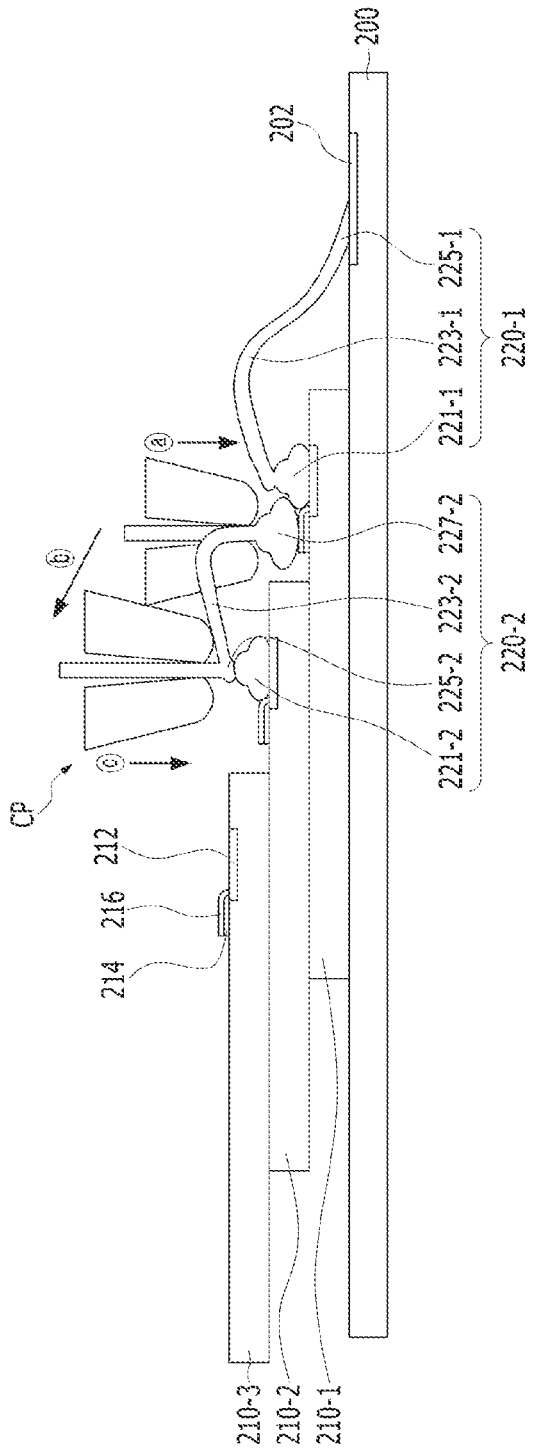

FIGS. 5A and 5B are cross-sectional views illustrating an example of a method of forming a bonding wire in the semiconductor package of FIGS. 4A and 4B.

Referring to FIG. 5A, the first bonding wire 220-1 that connects the chip pad 212 of the first semiconductor chip 210-1 to the pad 202 of the base layer 200 may be formed. This process may be substantially the same as the process of FIG. 2A. That is, ball bonding may be performed to form the first ball bump 221-1 that is bonded to the chip pad 212 of the first semiconductor chip 210-1, the first wire loop 223-1 that extends from the first ball bump 221-1 may be formed, and then, stitch bonding may be performed to form the first bonding portion 225-1 that is bonded to the pad 202 of the base layer 200.

Subsequently, the capillary CP may move over the chip pad 212 of the second semiconductor chip 210-2 to perform ball bonding, and thus, the second ball bump 221-2 that is bonded to the chip pad 212 of the second semiconductor chip 210-2 may be formed (see (a)). Subsequently, the capillary CP may cut the wire on the second ball bump 221-1 (see (b)).

Referring to FIG. 5B, the capillary CP may move over the redistribution pad 216 of the first semiconductor chip 210-1 to perform ball bonding, and thus, the additional second ball bump 227-2 that is bonded to the redistribution pad 216 of the first semiconductor chip 210-1 may be formed (see (a)).

Subsequently, while the capillary CP moves in a direction toward the chip pad 212 of the second semiconductor chip 210-2, the second wire loop 223-2 that extends from the additional second ball bump 227-2 may be formed (see (b)).

Subsequently, the capillary CP may move over the chip pad 212 of the second semiconductor chip 210-2 to perform stitch bonding, and thus, the second bonding portion 225-2 that is bonded to the second ball bump 221-2 may be formed (see (c)). As a result, the second bonding wire 220-2 may be formed.

Other bonding wires that connect the semiconductor chips to each other may be formed by substantially the same process as the process of forming the second bonding wire 220-2.

According to the semiconductor package and the bonding wire forming method described above, the following effects may be obtained.

According to the present embodiment, the connection between the bonding wires may not performed by direct contact/bonding of the bonding wire as in the comparative example. In the present embodiment, the connection between the bonding wires may be performed such that one end of one bonding wire is connected to a chip pad, the other end of another bonding wire is connected to a redistribution pad, and the chip pad and the redistribution pad are connected to each other. Accordingly, the problems occurring in the comparative example, for example, the problem in which the contact area between the bonding wires is reduced during forward bonding, or the problem in which bonding stress is applied several times to one chip pad during reverse bonding, and a process defect resulting therefrom may be all solved.

In addition, by forming the redistribution pad to partially overlap the chip pad, an increase in the area of the chip pad portion due to the additional formation of the redistribution pad may be prevented as much as possible. If the redistribution pad that extends in the offset direction is formed by using a general redistribution, the bonding stress may also be reduced, but the offset value may increase because the redistribution pad must be exposed. This may lead to an increase in the planar area of the semiconductor package. However, according to the present embodiment, because only the redistribution pad is formed without redistribution and a part of the chip pad is used as a bonding area in order to minimize the size of the redistribution pad, it may be possible to minimize the increase in the offset value and the increase in the planar area of the semiconductor package.

In addition, even if the redistribution pad partially overlaps the chip pad, the upper surface of the redistribution pad may be located at a level higher than the upper surface of the chip pad, and thus, the influence between the bonding process to the redistribution pad and the bonding process to the chip pad may be minimized. That is, as an example, during the bonding process to the redistribution pad, an interference phenomenon in which the capillary contacts the wire that is connected to the chip pad and the wire is deformed, may not occur.

Further, because all the problems occurring during forward bonding/reverse bonding can be solved, there is no restriction on the bonding wire forming method in the present embodiment. In FIGS. 5A and 5B, a case in which the second and third bonding wires 220-2 and 220-3 are formed by a reverse bonding method has been described. In this case, because the height of the wire loop is low, the interference between adjacent wires may decrease and the movable space of the capillary may increase, and thus, the degree of process freedom may increase. However, the bonding wires may be formed by a forward bonding method as shown in FIG. 6 to be described later.

Figure 6:
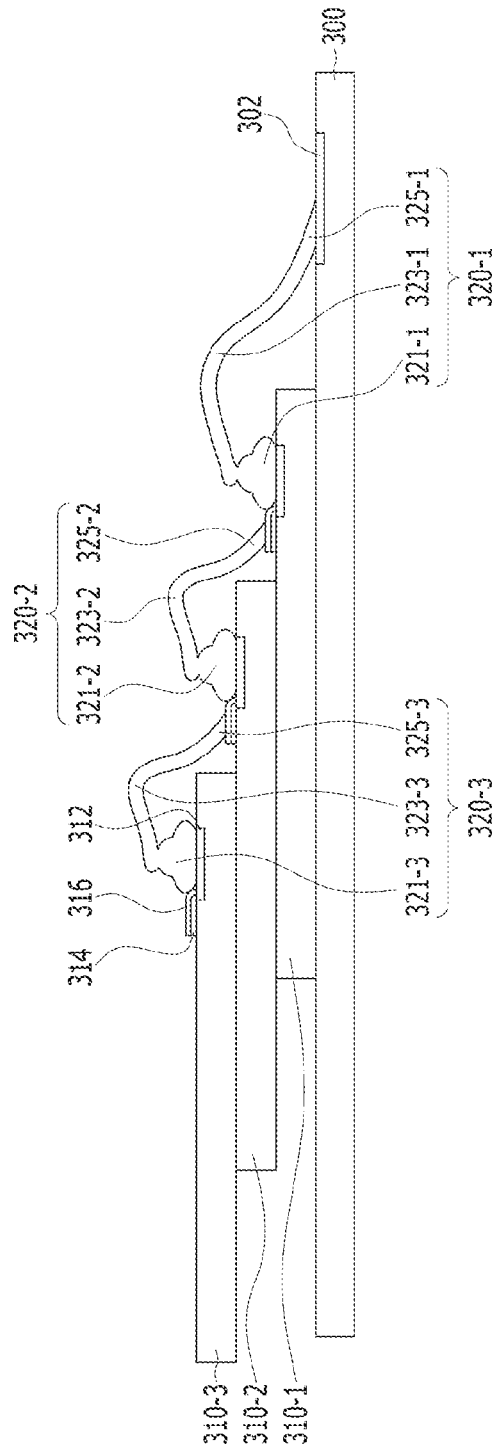
FIG. 6 is a cross-sectional view illustrating a semiconductor package and a bonding wire forming method according to another embodiment of the present disclosure.

FIG. 6 is a cross-sectional view illustrating a semiconductor package and a bonding wire forming method according to another embodiment of the present disclosure.

Referring to FIG. 6, the semiconductor package of the present embodiment may include a base layer 300, first to third semiconductor chips 310-1 to 310-3 stacked over one surface of the base layer 300, a first bonding wire 320-1 that connects the base layer 300 and the first semiconductor chip 310-1 to each other, a second bonding wire 320-2 that connects the first semiconductor chip 310-1 and the second semiconductor chip 310-2 to each other, and a third bonding wire 320-3 that connects the second semiconductor chip 310-2 and the third semiconductor chip 310-3 to each other.

Chip pads 312 may be disposed in one side edge region of an upper surface of each of the first to third semiconductor chips 310-1 to 310-3. In this case, the first to third semiconductor chips 310-1 to 310-3 may be offset stacked over the base layer 300 so that all the chip pads 312 are exposed.

Further, on the upper surface of each of the first to third semiconductor chips 310-1 to 310-3, a stacked structure of an insulating pattern 314 and a redistribution pad 316 may be formed. The stacked structure of the insulating pattern 314 and the redistribution pad 316 may extend outside the chip pad 312 while partially contacting the chip pad 312. In the present embodiment, the extension direction of the insulating pattern 314 and the redistribution pad 316 may be the same as the offset direction of the first to third semiconductor chips 310-1 to 310-3.

The first bonding wire 320-1 may connect the chip pad 312 of the first semiconductor chip 310-1 and the pad 302 of the base layer 300 to each other. The first bonding wire 320-1 may include a first ball bump 321-1 that is bonded to the chip pad 312 of the first semiconductor chip 310-1, a first bonding portion 325-1 that is bonded to the pad 302 of the base layer 300, and a first wire loop 323-1 that extends between the first ball bump 321-1 and the first bonding portion 325-1. The first ball bump 321-1 may be formed by ball bonding, and the first bonding portion 325-1 may be formed by stitch bonding.

The second bonding wire 320-2 may connect the redistribution pad 316 of the first semiconductor chip 310-1 and the chip pad 312 of the second semiconductor chip 310-2 to each other. The second bonding wire 320-2 may include a second ball bump 321-2 that is bonded to the chip pad 312 of the second semiconductor chip 310-2, a second bonding portion 325-2 that is bonded to the redistribution pad 316 of the first semiconductor chip 310-1, and a second wire loop 323-2 that extends between the second ball bump 321-2 and the second bonding portion 325-2. The second ball bump 321-2 may be formed by ball bonding, and the second bonding portion 325-2 may be formed by stitch bonding.

The third bonding wire 320-3 may connect the redistribution pad 316 of the second semiconductor chip 310-2 and the chip pad 312 of the third semiconductor chip 310-3 to each other. The third bonding wire 320-3 may include a third ball bump 321-3 that is bonded to the chip pad 312 of the third semiconductor chip 310-3, a third bonding portion 325-3 that is bonded to the redistribution pad 316 of the second semiconductor chip 310-2, and a third wire loop 323-3 that extends between the third ball bump 321-3 and the third bonding portion 325-3. The third ball bump 321-3 may be formed by ball bonding, and the third bonding portion 325-3 may be formed by stitch bonding.

Figure 7:
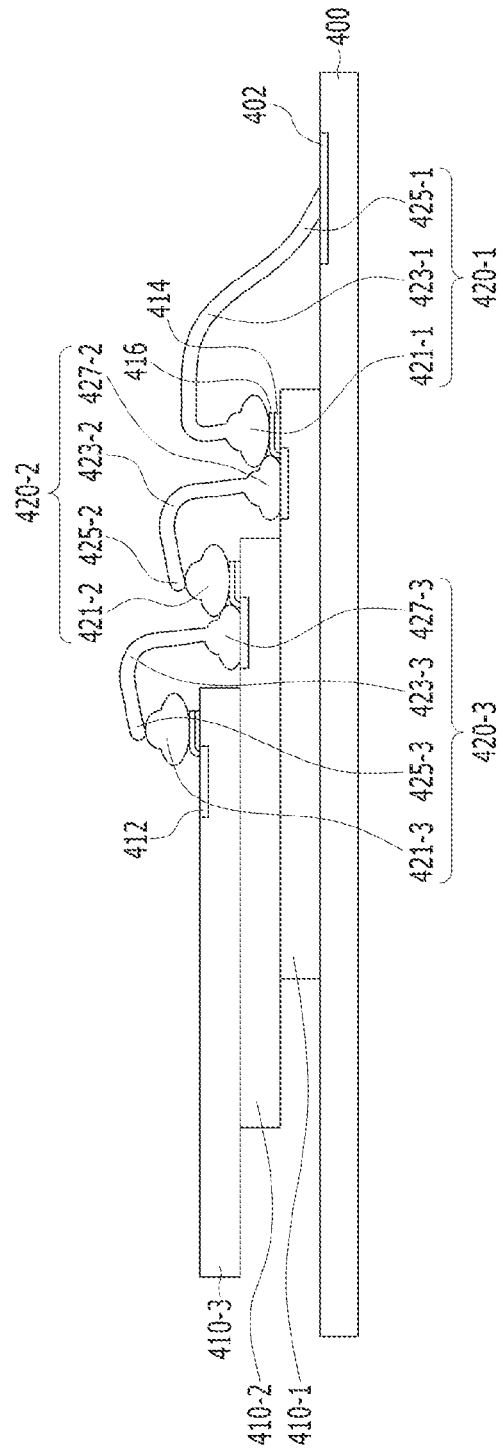
FIG. 7 is a cross-sectional view illustrating a semiconductor package and a bonding wire forming method according to another embodiment of the present disclosure.

FIG. 7 is a cross-sectional view illustrating a semiconductor package and a bonding wire forming method according to another embodiment of the present disclosure.

Referring to FIG. 7, the semiconductor package of the present embodiment may include a base layer 400, first to third semiconductor chips 410-1 to 410-3 stacked over one surface of the base layer 400, a first bonding wire 420-1 that connects the base layer 400 and the first semiconductor chip 410-1 to each other, a second bonding wire 420-2 that connects the first semiconductor chip 410-1 and the second semiconductor chip 410-2 to each other, and a third bonding wire 420-3 that connects the second semiconductor chip 410-2 and the third semiconductor chip 410-3 to each other.

Chip pads 412 may be disposed in one side edge region of an upper surface of each of the first to third semiconductor chips 410-1 to 410-3. In this case, the first to third semiconductor chips 410-1 to 410-3 may be offset stacked over the base layer 400 so that all the chip pads 412 are exposed.

Further, on the upper surface of each of the first to third semiconductor chips 410-1 to 410-3, a stacked structure of an insulating pattern 414 and a redistribution pad 416 may be formed.

The stacked structure of the insulating pattern 414 and the redistribution pad 416 may extend outside the chip pad 412 while partially contacting the chip pad 412. In the present embodiment, an extension direction of the insulating pattern 414 and the redistribution pad 416 may be opposite to the offset direction of the first to third semiconductor chips 410-1 to 410-3.

The first bonding wire 420-1 may connect the redistribution pad 416 of the first semiconductor chip 410-1 and the pad 402 of the base layer 400 to each other. The first bonding wire 420-1 may include a first ball bump 421-1 that is bonded to the redistribution pad 416 of the first semiconductor chip 410-1, a first bonding portion 425-1 that is bonded to the pad 402 of the base layer 400, and a first wire loop 423-1 that extends between the first ball bump 421-1 and the first bonding portion 425-1. The first ball bump 421-1 may be formed by ball bonding, and the first bonding portion 425-1 may be formed by stitch bonding.

The second bonding wire 420-2 may connect the chip pad 412 of the first semiconductor chip 410-1 and the redistribution pad 416 of the second semiconductor chip 410-2 to each other. The second bonding wire 420-2 may include a second ball bump 421-2 that is bonded to the redistribution pad 416 of the second semiconductor chip 410-2, an additional second ball bump 427-2 that is bonded to the chip pad 412 of the first semiconductor chip 410-1, a second wire loop 423-2 that extends from the additional second ball bump 427-2 to the second ball bump 421-2, and a second bonding portion 425-2 that is bonded to the second ball bump 421-2 at one end of the second wire loop 423-2. The second ball bump 421-2 and the additional second ball bump 427-2 may be formed by ball bonding, and the second bonding portion 425-2 may be formed by stitch bonding.

The third bonding wire 420-3 may connect the chip pad 412 of the second semiconductor chip 410-2 and the redistribution pad 416 of the third semiconductor chip 410-3 to each other. The third bonding wire 420-3 may include a third ball bump 421-3 that is bonded to the redistribution pad 416 of the third semiconductor chip 410-3, an additional third ball bump 427-3 that is bonded to the chip pad 412 of the second semiconductor chip 410-2, a third wire loop 423-3 that extends from the additional third ball bump 427-3 to the third ball bump 421-3, and a third bonding portion 425-3 that is bonded to the third ball bump 421-2 at one end of the third wire loop 423-3. The third ball bump 421-3 and the additional third ball bump 427-3 may be formed by ball bonding, and the third bonding portion 425-3 may be formed by stitch bonding.

According to the present embodiment, all of the effects described in the above-described embodiments of FIGS. 5A and 5B may be obtained. Furthermore, securing the moving space of the capillary may be maximized. In the present embodiment, unlike FIG. 4D, the ball bump, for example, 421-2 in FIG. 7, may contact/bond with the upper surface of the redistribution pad 416 and a part of the additional ball bump, for example, 427-3 in FIG. 7, at the same time. The part of the additional ball bump, which is in contact with the ball bump, may be located at substantially the same level as the upper surface of the redistribution pad 416.

In FIG. 7, a case in which the second and third bonding wires 420-2 and 420-3 are formed by the reverse bonding method has been described, but may be formed by the above-described forward bonding method (refer to FIG. 6). In this case, although not illustrated, each of the second and third bonding wires 420-2 and 420-3 may include a ball bump that is bonded to a redistribution pad, a bonding portion that is bonded to a chip pad, and a wire loop that extends therebetween.

According to the above embodiments of the present disclosure, it may be possible to provide a semiconductor package capable of reducing process defects while satisfying the demands of high performance/high capacity.

Figure 8:
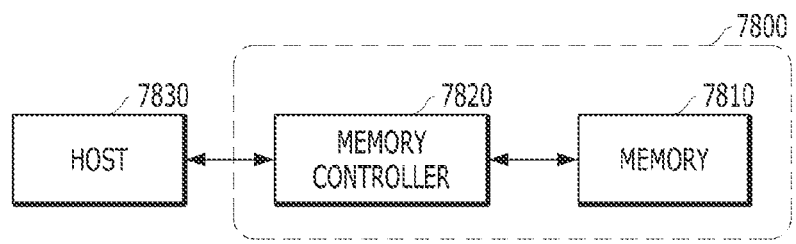
FIG. 8 shows a block diagram illustrating an electronic system employing a memory card including a semiconductor package, according to an embodiment.

FIG. 8 shows a block diagram illustrating an electronic system including a memory card 7800 employing at least one of the semiconductor packages according to the embodiments. The memory card 7800 includes a memory 7810, such as a nonvolatile memory device, and a memory controller 7820. The memory 7810 and the memory controller 7820 may store data or read out the stored data. At least one of the memory 7810 and the memory controller 7820 may include at least one of the semiconductor packages according to described embodiments.

The memory 7810 may include a nonvolatile memory device to which the technology of the embodiments of the present disclosure is applied. The memory controller 7820 may control the memory 7810 such that stored data is read out or data is stored in response to a read/write request from a host 7830.

Figure 9:
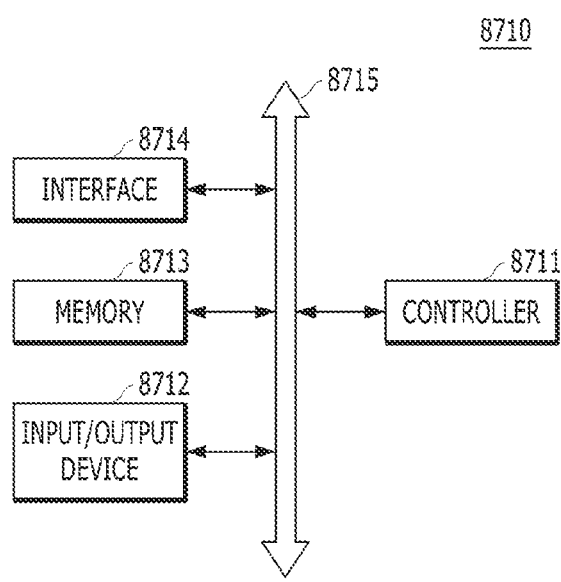
FIG. 9 shows a block diagram illustrating another electronic system including a semiconductor package, according to an embodiment.

FIG. 9 shows a block diagram illustrating an electronic system 8710 including at least one of the semiconductor packages according to described embodiments. The electronic system 8710 may include a controller 8711, an input/output device 8712, and a memory 8713. The controller 8711, the input/output device 8712, and the memory 8713 may be coupled with one another through a bus 8715 providing a path through which data move.

In an embodiment, the controller 8711 may include one or more microprocessor, digital signal processor, microcontroller, and/or logic device capable of performing the same functions as these components. The controller 8711 or the memory 8713 may include one or more of the semiconductor packages according to the embodiments of the present disclosure. The input/output device 8712 may include at least one selected among a keypad, a keyboard, a display device, a touchscreen and so forth. The memory 8713 is a device for storing data. The memory 8713 may store data and/or commands to be executed by the controller 8711, and the like.

The memory 8713 may include a volatile memory device such as a DRAM and/or a nonvolatile memory device such as a flash memory. For example, a flash memory may be mounted to an information processing system such as a mobile terminal or a desktop computer. The flash memory may constitute a solid state disk (SSD). In this case, the electronic system 8710 may stably store a large amount of data in a flash memory system.

The electronic system 8710 may further include an interface 8714 configured to transmit and receive data to and from a communication network. The interface 8714 may be a wired or wireless type. For example, the interface 8714 may include an antenna or a wired or wireless transceiver.

The electronic system 8710 may be realized as a mobile system, a personal computer, an industrial computer, or a logic system performing various functions. For example, the mobile system may be any one of a personal digital assistant (PDA), a portable computer, a tablet computer, a mobile phone, a smart phone, a wireless phone, a laptop computer, a memory card, a digital music system, and an information transmission/reception system.

If the electronic system 8710 represents equipment capable of performing wireless communication, the electronic system 8710 may be used in a communication system using a technique of CDMA (code division multiple access), GSM (global system for mobile communications), NADC (north American digital cellular), E-TDMA (enhanced-time division multiple access), WCDMA (wideband code division multiple access), CDMA2000, LTE (long term evolution), or Wibro (wireless broadband Internet).

Although various embodiments have been described for illustrative purposes, it will be apparent to those skilled in the art that various changes and modifications may be made without departing from the spirit and scope of the present teachings as defined in the following claims.

What is claimed is:

1. A semiconductor package comprising:
   a base layer having a pad, wherein the pad is disposed over an upper surface of the base layer;
   first to third semiconductor chips offset stacked over the base layer in a staircase,
   wherein:
      the first semiconductor chip includes a first chip pad and a first redistribution pad electrically connected to each other, wherein the first chip pad and the first redistribution pad are disposed over an upper surface of the first semiconductor chip,
      the second semiconductor chip includes a second chip pad and a second redistribution pad electrically connected to each other, wherein the second chip pad and the second redistribution pad are disposed over an upper surface of the second semiconductor chip, and
      the third semiconductor chip includes a third chip pad and a third redistribution pad electrically connected to each other, wherein the third chip pad and the third redistribution pad are disposed over an upper surface of the third semiconductor chip;
   a first bonding wire electrically connecting the pad to the first chip pad;
   a second bonding wire electrically connecting the first redistribution pad to the second chip pad; and
   a third bonding wire electrically connecting the second redistribution pad to the third chip pad.

2. The semiconductor package according to claim 1,
   wherein each of the first to third semiconductor chips includes a passivation layer covering each of the upper surfaces of the first to third semiconductor chips,
   wherein the passivation layer has an opening exposing each of the first to third chip pads,
   wherein each of the first to third redistribution pads is disposed over the passivation layer.

3. The semiconductor package according to claim 2,
   wherein each of the first to third semiconductor chips further includes an insulating pattern interposed between the first redistribution pad and the passivation layer, between the second redistribution pad and the passivation layer, and between the third redistribution pad and the passivation layer.

4. The semiconductor package according to claim 1,
   wherein, in a top view, the first to third redistribution pads partially overlap with the first to third chip pads, respectively.

5. The semiconductor package according to claim 1,
   wherein the first to third redistribution pads are disposed at a higher level than the first to third chip pads, respectively.

6. The semiconductor package according to claim 1,
   wherein:
      the first bonding wire includes:
         a first ball bump disposed on the first chip pad;
         a first bonding portion connected to the pad; and
         a first wire loop connecting the first ball bump to the first bonding portion,
      the second bonding wire includes:
         a second ball bump disposed on the second chip pad;
         a second bonding portion connected to the first redistribution pad; and
         a second wire loop connecting the second ball bump to the second bonding portion, and the third bonding wire includes:
   a third ball bump disposed on the third chip pad;
   a third bonding portion connected to the second redistribution pad; and
   a third wire loop connecting the third ball bump to the third bonding portion.

7. The semiconductor package according to claim 1, wherein:
the first bonding wire includes:
   a first ball bump disposed on the first chip pad;
   a first bonding portion connected to the pad; and
   a first wire loop connecting the first ball bump to the first bonding portion,
the second bonding wire includes:
   a second ball bump disposed on the second chip pad;
   a first additional ball bump disposed on the first redistribution pad; and
   a second wire loop connecting the second ball bump to the first additional ball bump, and
the third bonding wire includes:
   a third ball bump disposed on the third chip pad;
   a second additional ball bump disposed on the second redistribution pad; and
   a third wire loop connecting the third ball bump to the second additional ball bump.

8. The semiconductor package according to claim 7, wherein:
the first additional ball bump is in contact with both the first redistribution pad and the first ball bump, and
the second additional ball bump is in contact with both the second redistribution pad and the second ball bump.

9. The semiconductor package according to claim 1, wherein:
the first redistribution pad is disposed closer to the second semiconductor chip than the first chip pad,
the second redistribution pad is disposed closer to the third semiconductor chip than the second chip pad, and
the third chip pad is disposed closer to the second semiconductor chip than the third redistribution pad.

10. A semiconductor package comprising:
a base layer having a pad, wherein the pad is disposed over an upper surface of the base layer;
first to third semiconductor chips offset stacked over the base layer in a staircase,
wherein:
   the first semiconductor chip includes a first chip pad and a first redistribution pad electrically connected to each other, wherein the first chip pad and the first redistribution pad are disposed over an upper surface of the first semiconductor chip,
   the second semiconductor chip includes a second chip pad and a second redistribution pad electrically connected to each other, wherein the second chip pad and the second redistribution pad are disposed over an upper surface of the second semiconductor chip, and
   the third semiconductor chip includes a third chip pad and a third redistribution pad electrically connected to each other, wherein the third chip pad and the third redistribution pad are disposed over an upper surface of the third semiconductor chip;
a first bonding wire electrically connecting the pad to the first redistribution pad;
a second bonding wire electrically connecting the first chip pad to the second redistribution pad; and
a third bonding wire electrically connecting the second chip pad to the third redistribution pad.

11. The semiconductor package according to claim 10, wherein:
the first chip pad is disposed closer to the second semiconductor chip than the first redistribution pad,
the second chip pad is disposed closer to the third semiconductor chip than the second redistribution pad, and
the third redistribution pad is disposed closer to the second semiconductor chip than the third chip pad.

12. The semiconductor package according to claim 10, wherein:
the first bonding wire includes:
   a first ball bump disposed on the first redistribution pad;
   a first bonding portion connected to the pad; and
   a first wire loop connecting the first ball bump to the first bonding portion,
the second bonding wire includes:
   a second ball bump disposed on the second redistribution pad;
   a second bonding portion connected to the first chip pad; and
   a second wire loop connecting the second ball bump to the second bonding portion,
the third bonding wire includes:
   a third ball bump disposed on the third redistribution pad;
   a third bonding portion connected to the second chip pad; and
   a third wire loop connecting the third ball bump to the third bonding portion.

13. The semiconductor package according to claim 10, wherein:
the first bonding wire includes:
   a first ball bump disposed on the first redistribution pad;
   a first bonding portion connected to the pad; and
   a first wire loop connecting the first ball bump to the first bonding portion,
the second bonding wire includes:
   a second ball bump disposed on the second redistribution pad;
   a first additional ball bump disposed on the first chip pad; and
   a second wire loop connecting the second ball bump to the first additional ball bump,
the third bonding wire includes:
   a third ball bump disposed on the third redistribution pad;
   a second additional ball bump disposed on the second chip pad; and
   a third wire loop connecting the third ball bump to the second additional ball bump.

14. The semiconductor package according to claim 13, wherein:
the first additional ball bump is in contact with both the first chip pad and the first ball bump, and
the second additional ball bump is in contact with both the second chip pad and the second ball bump.

15. The semiconductor package according to claim 10, wherein each of the first to third semiconductor chips includes a passivation layer covering each of the upper surfaces of the first to third semiconductor chips,
wherein the passivation layer has an opening exposing each of the first to third chip pads,
wherein each of the first to third redistribution pads is disposed over the passivation layer.

16. The semiconductor package according to claim 15, wherein each of the first to third semiconductor chips further includes an insulating pattern interposed between the first redistribution pad and the passivation layer, between the second redistribution pad and the passivation layer, and between the third redistribution pad and the passivation layer.

17. The semiconductor package according to claim 10, wherein, in a top view, the first to third redistribution pads partially overlap with the first to third chip pads, respectively.

18. The semiconductor package according to claim 10, wherein the first to third redistribution pads are disposed at a higher level than the first to third chip pads, respectively.

19. A semiconductor package comprising:
a base layer comprises a pad, wherein the pad is disposed over an upper surface of the base layer;
first to third semiconductor chips offset stacked over the upper surface of the base layer in a staircase,
wherein:
the first semiconductor chip comprises a first chip pad and a first redistribution pad electrically connected to each other, wherein the first chip pad and the first redistribution pad are disposed over an upper surface of the first semiconductor chip,
the second semiconductor chip comprises a second chip pad and a second redistribution pad electrically connected to each other, wherein the second chip pad and the second redistribution pad are disposed over an upper surface of the second semiconductor chip, and
the third semiconductor chip comprises a third chip pad and a third redistribution pad electrically connected to each other, wherein the third chip pad and the third redistribution pad are disposed over an upper surface of the third semiconductor chip,
a first bonding wire electrically connecting the pad of the base layer to the first chip pad of the first semiconductor chip;
a second bonding wire electrically connecting the first redistribution pad of the first semiconductor chip to the second chip pad of the second semiconductor chip; and
a third bonding wire electrically connecting the second redistribution pad of the second semiconductor chip to the third chip pad of the third semiconductor chip.

20. The semiconductor package according to claim 19, wherein each of the first to third semiconductor chips includes a passivation layer covering each of the upper surfaces of the first to third semiconductor chips,
wherein the passivation layer has an opening exposing each of the first to third chip pads,
wherein each of the first to third redistribution pads is disposed over the passivation layer.

* * * * *